(12) United States Patent
Cox et al.

(10) Patent No.: US 8,681,316 B2
(45) Date of Patent: Mar. 25, 2014

(54) MEASUREMENT SYSTEM, METHOD AND LITHOGRAPHIC APPARATUS

(75) Inventors: Henrikus Herman Marie Cox, Eindhoven (NL); Willem Herman Gertruda Anna Koenen, Roermond (NL); Thomas Augustus Mattaar, Veldhoven (NL); Martinus Theodorus Jacobus Pieterse, Veldhoven (NL); Rob Antonius Andries Verkooijen, Dongen (NL)

(73) Assignee: ASML Netherlands B.V., Veldhoven (NL)

( * ) Notice: Subject to any disclaimer, the term of this patent is extended or adjusted under 35 U.S.C. 154(b) by 392 days.

(21) Appl. No.: 13/116,934

(22) Filed: May 26, 2011

(65) Prior Publication Data

US 2011/0317142 A1    Dec. 29, 2011

Related U.S. Application Data

(60) Provisional application No. 61/358,277, filed on Jun. 24, 2010.

(51) Int. Cl.
*G01C 9/00* (2006.01)
*G03B 27/32* (2006.01)
*G03B 27/42* (2006.01)
*H02K 41/02* (2006.01)

(52) U.S. Cl.
USPC ............. 355/77; 310/12.19; 355/53; 702/150

(58) Field of Classification Search
CPC ... G03F 7/70; G03F 7/70491; G03F 7/70716; G03F 7/70725; G03F 7/70775; G03F 7/70783

USPC ................. 310/12.05, 12.06, 12.19; 318/649; 355/53, 72, 75, 77; 702/150

See application file for complete search history.

(56) References Cited

U.S. PATENT DOCUMENTS 6,813,000 B1 * 11/2004 Nishi ............................. 355/53
7,119,886 B2    10/2006 Leenders et al.
(Continued)

FOREIGN PATENT DOCUMENTS

CN          1650148      8/2005
CN         101216342     7/2008
(Continued)

OTHER PUBLICATIONS

Japanese Office Action mailed Oct. 1, 2012 in corresponding Japanese Patent Application No. 2011-134786.

(Continued)

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A measurement system is configured to derive a position quantity of an object, the measurement system includes at least one position quantity sensor configured to provide respective position quantity measurement signals; a position quantity calculator configured to determine a position quantity of the object from the position quantity measurement signal, wherein the position quantity calculator includes a torsion estimator configured to estimate a torsion of the object, the position quantity calculator being configured to correct the determined position quantity of the object for the estimated torsion.

18 Claims, 3 Drawing Sheets

(56) References Cited

U.S. PATENT DOCUMENTS

| | | |
|---|---|---|
| 7,640,142 B2 | 12/2009 | Tachikawa et al. |
| 7,710,540 B2 | 5/2010 | Loopstra et al. |
| 7,782,446 B2 | 8/2010 | Kamidi et al. |
| 2002/0001082 A1* | 1/2002 | Akimoto et al. ............... 356/400 |
| 2007/0024864 A1 | 2/2007 | Tachikawa et al. |
| 2007/0258079 A1 | 11/2007 | Kamidi et al. |
| 2008/0018877 A1 | 1/2008 | Butler et al. |
| 2008/0212054 A1 | 9/2008 | Kamidi et al. |
| 2008/0218713 A1 | 9/2008 | Shibazaki |
| 2008/0246936 A1 | 10/2008 | Loopstra et al. |
| 2010/0001168 A1* | 1/2010 | Saiki et al. .................... 248/550 |
| 2011/0032496 A1* | 2/2011 | Shibazaki ....................... 355/30 |

FOREIGN PATENT DOCUMENTS

| | | |
|---|---|---|
| EP | 0 559 397 | 9/1993 |
| JP | 9-326351 | 12/1997 |
| JP | 2002-055719 | 2/2002 |
| JP | 2004-335510 | 11/2004 |
| JP | 2007-033282 | 2/2007 |
| KR | 10-2008-0080459 | 9/2008 |
| TW | 200848957 | 12/2008 |

OTHER PUBLICATIONS

Korean Office Action mailed Dec. 28, 2012 in corresponding Korean Patent Application No. 10-2011-0061288.

* cited by examiner

MEASUREMENT SYSTEM, METHOD AND LITHOGRAPHIC APPARATUS

CROSS REFERENCE TO RELATED APPLICATIONS

This application claims priority and benefit under 35 U.S.C. §119(e) to U.S. Provisional Patent Application No. 61/358,277, entitled "Measurement System, Method and Lithographic Apparatus", filed on Jun. 24, 2010. The content of that application is incorporated herein in its entirety by reference.

FIELD

The present invention relates to a measurement system, a lithographic apparatus comprising such measurement system and a measurement method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An object, such as a stage of a lithographic apparatus, may in use exhibit non rigid body mass behavior. In particular, this may be the case in situations where the object is subjected to high forces, for example in order to move the object with high velocity and acceleration. An example of such non rigid body mass behavior is torsion. In a measurement system that measures a position of the object, a plurality of position sensors are connected to the object spaced apart from each other, position information from two or more position sensors may be applied. In a lithographic apparatus, an example of such a configuration may be found in stage position measurement, e.g. substrate table position measurement or support (e.g. mask table) position measurement. A plurality of sensors (e.g. encoders, interferometers) are provided in order to measure a vertical (and or horizontal) position of the stage. The multiple vertical position measurements may be applied to calculate a vertical translation (Z) and 1 or 2 tilt rotations (Rx, Ry) about horizontal axis (y respectively x-axis) of the stage. A torsion mode of the stage seen in the vertical or tilt open loop mechanics—may therefore result in differences in the readout of the position sensors, as during excitation of such torsion modes, vertical displacement of parts of the stage may occur. If the stage is positioned in the horizontal plane, the vertical dynamics may show different amplification of the torsion mode at different horizontal positions. In order to reduce an effect of such torsion mode excitations on e.g. closed loop position control loop behavior, several solutions have been devised. Firstly, a bandwidth of the loop may be kept relatively low, which however has adverse effects on speed, accuracy of positioning, etc. Secondly, notch filters may be applied in order to reduce frequency components of the sensor signals in a frequency range where the excitation of the torsion mode resides. Advanced control solutions are considered to require complex calculations (e.g. position dependent Notch filters) and therefore impose a high data processing load in the lithographic apparatus.

SUMMARY

It is desirable to provide an improved measurement system.

According to an embodiment of the invention, there is provided a measurement system configured to derive a position quantity of an object, the position quantity including at least one of position, velocity and acceleration, the measurement system including: at least one position quantity sensor configured to provide respective position quantity measurement signal; a position quantity calculator configured to determine a position quantity of the object from the position quantity measurement signal, wherein the position quantity calculator includes a torsion estimator configured to estimate a torsion of the object, the position quantity calculator being configured to correct the determined position quantity of the object for the estimated torsion.

In another embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, the lithographic apparatus including the measurement system as defined previously configured to measure a position quantity of one of the support, the substrate table and a projection lens element of the lithographic apparatus, the projection lens element being included as an optical element in a projection system of the lithographic apparatus.

According to a further embodiment of the invention, there is provided a position quantity measurement method to derive a position quantity of an object, the position quantity including at least one of position, velocity and acceleration, the measurement method including: providing by at least one position quantity sensor a respective position quantity measurement signal; estimating by a torsion estimator a torsion of the object, determining by a position quantity calculator a position quantity of the object from the position quantity measurement signal, and correcting the determined position quantity of the object for the estimated torsion.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
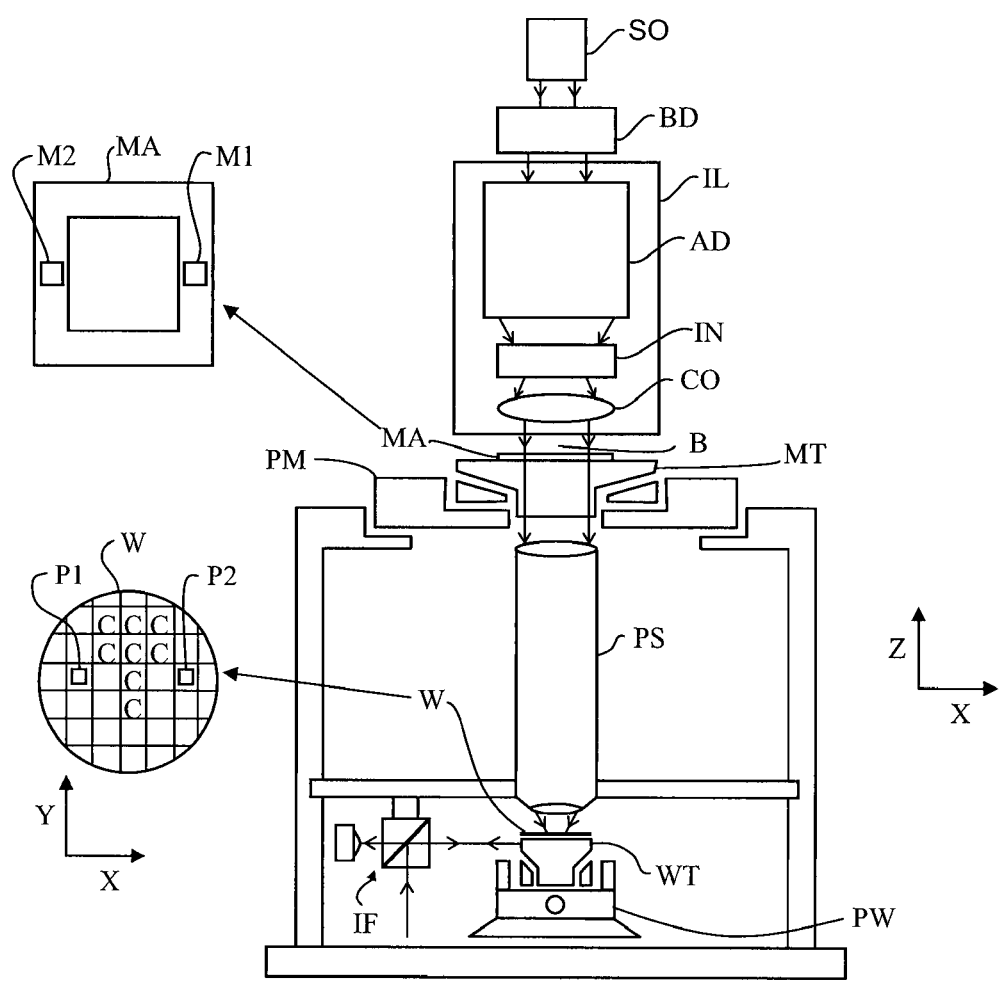
FIG. 1 depicts a lithographic apparatus in which the invention may be embodied.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
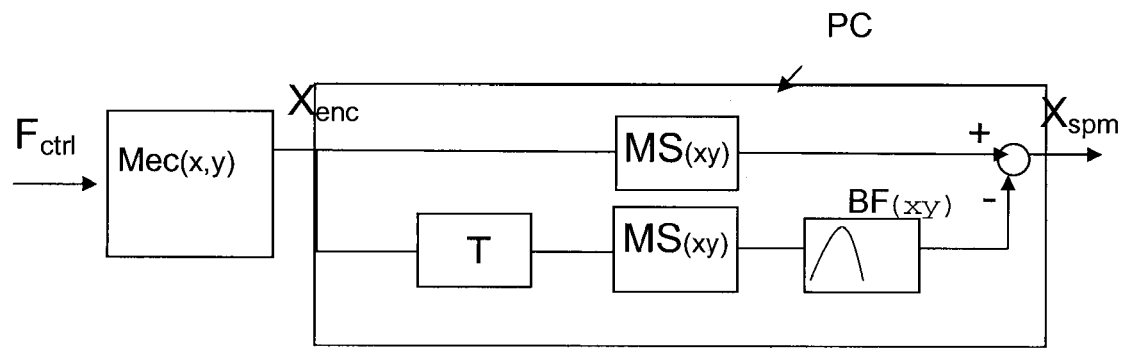
FIG. 2 depicts a block schematic diagram of a measurement system in accordance with an embodiment of the invention.

FIG. 2 depicts a schematic block diagram representation of a measurement system that is configured to measure a position of an object. A position of the object is measured by at least two position sensors, such as encoders, interferometers, capacitive position sensors, or any combination thereof. When a force Fctrl is exerted on a mechanics Mec(xy) of the object, the mechanics e.g. having a position dependent transfer function, this may result in a displacement of the object, which in turn results in a change in the values of a set of position measurement signals Xenc as provided by the position sensors. The positions sensor signals are provided to a position calculator PC including a Measurement System (MS), which calculates a position of the object from the obtained position measurement signals. The position calculator may thereby for example take account of a position of the object: in an embodiment, where the position sensors include encoder heads and/or interferometer heads which cooperate with a target (such as a grid plate), depending on the position of the object (and particularly in case of a relatively large range of movement of the object), one or more of the position sensors ($X_{enc}$ eg. position encoders) may or may not be able to cooperate with the grid plate, so that, depending on the position of the object, some of the position sensor signals may or may not be taken into account. Thus, a position dependent transfer function (of force to position) may be provided. In the example depicted in FIG. 2, the position calculator includes a position dependent measurement system transfer function MS(xy) that calculates the position Xspm (Stage position Measurement, also referred to as control co-ordinates).

The above approach may provide adequate results in case of a rigid body behavior of the object. In case however the object exhibits resonance modes, such as torsion modes or other non rigid body behavior, an erroneous position may be calculated as a result. For example, in case the sensors include vertical position sensors, the sensors being located—seen in the horizontal plane—at different parts of the object, and the object generally moves in a horizontal plane (such as may be the case when the object includes the substrate table or the support of the lithographic apparatus) torsion modes such may provide for differences in the positions as sensed by the position sensors for vertical position control. Since the position sensors provide a vertical measurement, the resulting vertical translation and tilts will also suffer from the torsion frequency. In the example of the object including the substrate table or the support, an accurate positioning of a part of the object may be required, namely the part of the object that is irradiated by the beam of radiation, as that part is required to be in focus at that moment in time. The torsion modes may thereby result in position dependent position measurement errors, hence e.g. resulting in position dependent focus and imaging errors. In case of an immersion lithography, whereby an immersion fluid is applied between for example a downstream lens of the projection system and a part of the substrate, resulting inertia forces from the immersion fluid on the part of the substrate—and hence on the part of the substrate table that supports the substrate, may also result in an position dependent amplification of the torsion frequency in the open loop dynamics of the substrate table.

As schematically depicted in FIG. 2, the position calculator of the measurement system includes a torsion estimator T configured to estimate a torsion of the object. The estimated torsion is applied by the position calculator to correct the determined position of the object for the estimated torsion. This is schematically illustrated in FIG. 2: a torsion of the object is estimated from the position sensor signals by torsion estimator T. As will be explained in more detail below, thereby use may be made of a known behavior of the object. Likewise to the position measurement signals that are provided to a measurement system transfer function, a same or similar measurement system transfer function is applied to the estimated torsion so as to obtain correction value(s). As torsion modes occur in certain frequency bands, a band filter BF may be applied on the thus obtained correction values, and a result of the filtering is applied to correct the determined position, in this example by subtracting the filtered correction values from the determined position. The new—for torsion corrected—position, is not or to a lesser extent, subjected to the torsion frequency, and therefore the Frequency Response Function of the open loop mechanics allows a higher servo bandwidth and thus an improved positioning accuracy. In an alternative embodiment a position dependent band filter, for example a band filter that is dependent from the x, y position of the object, may be implemented. Such a position dependent band filter has the benefit that a position dependent torsion mode of the object can be compensated more effectively.

Figure 3:
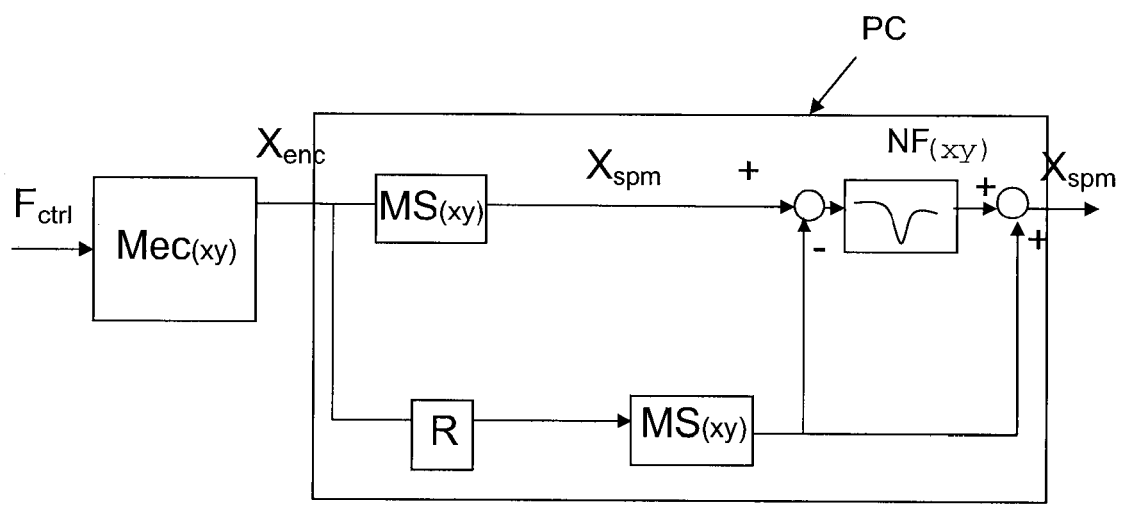
FIG. 3 depicts a block schematic diagram of a measurement system in accordance with another embodiment of the invention.

As depicted in FIG. 2, the band filter may include a band pass filter. Alternatively, as depicted in FIG. 3, the filter may include a band stop filter such as a notch Filter NF. The notch filter, which transmits a signal inputted to it, if outside an attenuation frequency band, and attenuates the signal if within the attenuation frequency band, may be provided in a forward path, i.e. the notch filter being applied to an output of the measurement system MS transfer function applied to the measured position. Likewise to the embodiment depicted in FIG. 2, a parallel path is provided in which the torsion estimator and the measurement system transfer function are provided. An output signal of the parallel path is subtracted before the notch filter and added after the notch filter. Hence, outside the attenuation band of the notch filter, the "normal" position signal is provided at the output of the measurement system, as any contribution by the torsion estimator in the parallel path is added before and subsequently subtracted after the notch filter. In the attenuation band of the notch filter however, the estimated torsion from the torsion estimator contributes to the output, while the "normal" position signal is attenuated. It is noted that in the embodiment in accordance with FIG. 3, instead of the torsion estimator matrix T, an estimator matrix R=I-T (whereby I is a unity matrix) is provided. This may be easily understood as follows: In the FIG. 3 embodiment, the parallel path determines a position that is compensated for torsion, the position being used, by means of the notch filter, in a frequency band in which the torsion occurs. In the FIG. 2, in the parallel path the component in the position that is caused by the torsion, is calculated. This component is subtracted, in the frequency band determined by the filter, from the calculated position. In an alternative embodiment a position dependent notch filter, for example a notch filter that is dependent from the x, y position of the object, may be implemented. Such a position dependent notch filter has the benefit that a position dependent torsion mode of the object can be compensated more effectively.

Hence, in both the embodiments in accordance with FIG. 2 and FIG. 3, the torsion estimator, due to the band filter, contributes to the position signal in the frequency band of the band filter. As the frequency band of the band filter is set to the frequency range in which the torsion mode in question occurs (e.g. as a resonance), the torsion estimator does substantially not affect the measured position in other frequency bands, while in the frequency band in which the torsion may occur, the output signal of the torsion estimator is passed to the output by the action of the band filter. Hence, in order to avoid any adverse effects from the torsion estimator at other frequencies, the torsion estimator is taken into account only in the frequency band in which the torsion mode may occur.

The torsion is estimated as follows:

Firstly, as expressed in 1] hereafter, a transfer function of a force applied onto the object to the position as measured by in this example a plurality of encoders, is calculated from a measured mechanical behavior of the object.

Secondly, as expressed in 2] hereafter, a decoupling matrix R near a frequency of the torsion, is determined. Thereto, firstly, a frequency dependent decoupling matrix R(f) is determined as depending on a quotient of a desired mechanics transfer function of the object and a measured mechanics transfer function of the object. Then, a mean of a real part of decoupling matrix is determined in the frequency range in which the torsion mode may occur, i.e. in the frequency range in which the band filter allows the torsion estimator to contribute to the determined position.

Thirdly, as expressed in 3] hereafter, a torsion estimation matrix (also referred to as torsion contribution matrix T) is determined from the matrix R and a unity matrix I.

Then, as expressed in 4] hereafter, the torsion estimator matrix is applied to correct the determined position, in the frequency band in which the torsion may occur. It is noted that the expression obtained in 4] mathematically describes the configuration depicted in and described with reference to FIG. 2.

An example of the procedure how to deduce the matrices T or R will be presented here:

1] Calculate FRF of force to encoder position $Hcm_{enc}(f)$ from measured mechanics $Hm_{meas}(f)$ $$Hm_{meas(f)} = MS_{(x,y)} * Hm_{raw(f)} * GB * GS_{(x,y)} = MS_{(x,y)} * I * Hcm_{enc(f)(x,y)}$$

2] Calculate real matrix R for de-coupling near torsion frequency $$Hm_{torsion\_decoupled(f)} = MS_{(x,y)} * R * Hcm_{enc(f)(x,y)} = \text{def} = Hm_{desired(f)}$$

$$=> R_{(f)} = MS_{(x,y)}^{-1} * Hm_{desired(f)} * Hcm_{enc(f)(x,y)}^{-1}$$

$$R = \text{mean}(\text{real}(R_{(f)}))$$

3] Calculate torsion contribution matrix T=I-R $$Hm_{torsion(f)} = Hm_{meas(f)} - Hm_{torsion\_decoupled(f)} =$$

$$MS_{(x,y)} * I * Hm_{raw(f)} * GB * GS_{(x,y)} - MS_{(x,y)} * R * Hcm_{enc(f)(x,y)} =$$

$$MS_{(x,y)} * (I-R) * Hcm_{enc(f)(x,y)} = \text{def} =$$

$$MS_{(x,y)} * T * Hcm_{enc(f)(x,y)} \text{ with } T=I-R$$

4] Compensate for torsion in frequency band filtered by Q(f) and evaluate result in frequency domain $$Hm_{TMC(f)} = Hm_{meas(f)} - Q_{(f)} * Hm_{torsional(f)} =$$

$$(MS_{(x,y)} - Q_{(f)} * MS_{(x,y)} * T) * Hcm_{enc(f)(x,y)}$$

$Hm_{meas}(f)$ is the measured compensated mechanics, the input is 6× logical control forces, output is 6× logical servo positions MS(x,y) is a XY-position dependent Measurement System $Hm_{raw}(f)$ is the raw mechanics, the input is 6× motor forces in [N], output is 8× encoder positions in [m], GB is a 6×6 gain balancing matrix transformation of logical forces at centre of gravity to forces at physical motors, GS is a 6×6 Gain Scheduling matrix that transforms xyz-position dependent controller forces to forces at the centre of gravity of the chuck.

$Hcm_{enc}(f)$ is mechanics with input 6× forces at center of gravity, output is 8× encoder positions in [m].

$Hm_{desired}(f)$ diagonal matrix of de-coupled rigid body dynamics.

R is a 4×4 real matrix that decouples the mechanics near the torsion frequency.

T is a 4×4 real matrix that calculates the torsion contribution.

Finally Q(f) is a band pass filter around the torsion frequency.

$Hcm_{torsion}(f)$ is the torsion content that must be removed from the FRF, $Hcm_{TMC}(f)$ is mechanics after compensation, so without torsion content.

Note that the R and T matrices are different if different combinations of sensors are applied to control the stage position (e.g. when switching between combinations of sensors).

It will be appreciated that other ways of torsion estimation may be provided also. E.g. instead of implementing a real matrix R or T one could implement a complex matrix R or T, e.g. using position and velocity information as input.

Again referring to the example wherein the sensors include vertical position sensors, the sensors being located—seen in the horizontal plane—at different parts of the object, and wherein the object generally moves in a horizontal plane (such as may be the case when the object includes the substrate table or the support of the lithographic apparatus). In this example, torsion modes may provide for differences in the positions as sensed by the position sensors. As mentioned, such situation may be the case if the object including the substrate table or the support, whereby an accurate positioning of a part of the object may be required. In case of four position sensors (provided e.g. at four corners of a rectangular object), whereby in a certain position one of the sensors does not provide a usable position signal—for example as the sensor in question is outside a reach of a grid plate with which it is to cooperate, position signals from only 3 position sensors are available. Due to the torsion mode, in case the torsion mode is active, 2 of the sensors may move in phase with each other in the vertical direction, while the other two may move in the vertical direction substantially in counter phase. In such situation, if all four sensors are within reach of the grid plate and provide a position signal, an averaging may allow to obtain a correct position of a center of the object (e.g. a center of the object between the four position sensors). In case a position is to be measured of another part of the object, for example more close to one of the sensors, different weighting factors may be applied to the sensor output signals. In such situation, in the described case that one of the sensors is outside reach of a grid plate, a weighting factor may be applied: the remaining sensor that moves in a same phase as the sensor that is outside reach, may be provided a double weight factor, so as to again allow the averaging over the 4 sensors. Hence, different torsion estimation matrixes may be provided depending on the combination of active sensors.

In a lithographic apparatus, the described torsion estimation and correction may not only be applied for a position measurement of a substrate stage and/or reticle stage (i.e. support). Other applications may include a position measurement of a projection lens element, such as a refractive lens element or a mirror. Thereby, effects of a torsion mode on an active lens element position control, may be reduced.

Figure 4A:
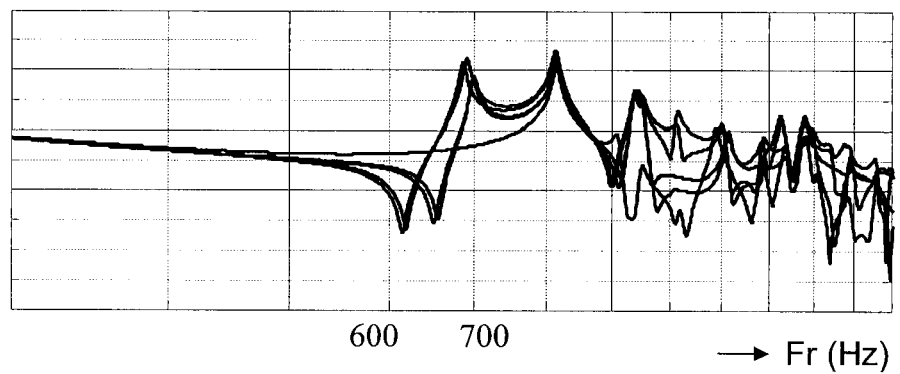
FIGS. 4a and 4b depicts a bode plot to illustrate an effect of the torsion estimation.
Figure 4B:
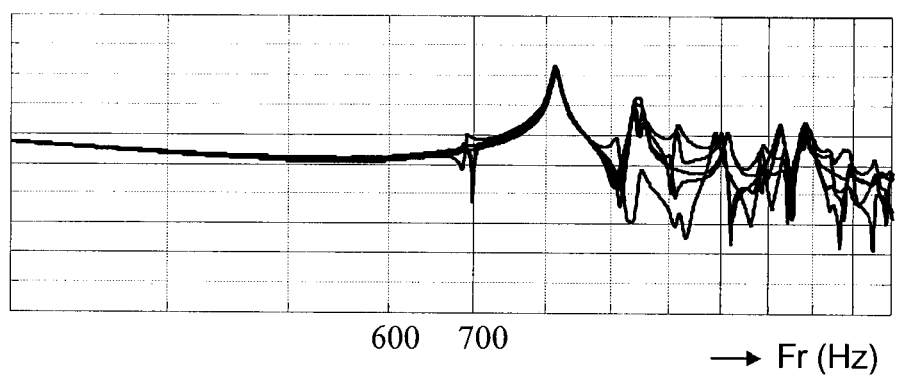

An effect of the torsion estimator is illustrated with reference to FIGS. 4a and 4b. FIG. 4a depicts a frequency response diagram of the various positions obtained from the position sensors of an (arbitrary) object. Peaks are observed in a range of 600-700 Hz as a result of torsion effects. In FIG. 4b, due to the torsion estimator, the peaks in the frequency response are substantially reduced, which allows a closed loop control of the position of the object to have a higher bandwidth.

It is noted that the position sensor may include any type of position sensor, such as but not restricted to: an interferometer, an encoder, a capacitive position sensor, an inductive position sensor, or any combination thereof. The torsion estimation may be applied in a lithographic apparatus, such as for measuring the position of the substrate table or the support, however other applications for measuring a position of an object are possible too. The position calculator and the torsion estimator may be implemented as suitable software instructions to be executed by a data processing device, such as a microprocessor, microcontroller, etc. Alternatively, the position calculator and/or the torsion estimator may partly or fully be implemented making use of dedicated hardware. It is to be understood that the torsion estimator may be applied to estimate any torsion mode of the object. In this text the torsion problem occurred in a position controlled stage. The skilled technician will appreciate that a similar approach is possible for torsion dynamics problems in a velocity or acceleration controlled stage. Thus, although in the above embodiments the term position is used, the explained concept may be applied to correct velocity and/or acceleration as well. Thus, where in these examples the term position is used, it could also be understood as velocity and/or acceleration. In case of velocity or acceleration, that is to be corrected for an estimated torsion, a corresponding velocity sensor or acceleration sensor may be applied. A velocity sensor may for example be implemented as a position sensor with a time differentiator so as to differentiate the position signal to obtain a velocity signal. Similarly, in the case of acceleration, an acceleration sensor may for example be implemented by twice differentiating a position signal from a position sensor. Any other implementation of velocity sensor and acceleration sensor is possible too within the context of the invention. In this document, the term position quantity is to be understood so as to include at least one of a position, a velocity and an acceleration. Hence, where in this description the term position is used, it may generally be replaced by the term position quantity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to, any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A measurement system configured to derive a position quantity of an object, the position quantity comprising at least one of position, velocity and acceleration, the measurement system comprising:
    a position quantity sensor configured to provide a position quantity measurement signal;
    a position quantity calculator configured to determine a position quantity of the object from the position quantity measurement signal,
    wherein the position quantity calculator comprises a torsion estimator configured to estimate a torsion of the object, the position quantity calculator being configured to correct the determined position quantity of the object from the estimated torsion.

2. The measurement system of claim 1, wherein the position quantity calculator comprises a band filter, the torsion estimator being provided in a parallel path of the position quantity calculator.

3. The measurement system of claim 2, wherein the band filter comprises a band stop filter, the position quantity calculator being configured to subtract a torsion corrected position quantity provided by the torsion estimator from the determined position quantity before the band stop filter and add the torsion corrected position quantity provided by the torsion estimator after the band stop filter.

4. The measurement system of claim 2, wherein the band filter comprises a band pass filter, the band pass filter and the torsion estimator being provided in a parallel path of the position quantity calculator.

5. The measurement system of claim 3, wherein the torsion estimator comprises a weighting factor matrix estimator configured to determine a weighting factor matrix from a quotient of a desired mechanics transfer function and a measured mechanics transfer function, the torsion estimator being configured to determine a torsion estimator matrix from the weighting factor matrix.

6. The measurement system of claim 5, wherein the torsion estimator is configured to determine a mean of a real part of the weighting factor matrix in a frequency band of the torsion, the torsion estimator being configured to determine the torsion estimator matrix from the mean real part of the weighting factor matrix.

7. The measurement system of claim 5, wherein the torsion estimator is configured to determine the torsion estimator matrix from a subtraction of a unity matrix and the weighting factor matrix.

8. The measurement system of claim 1, comprising more than one of the position quantity sensor and wherein the more than one of the position quantity sensor is configured to measure a vertical position quantity of the object.

9. The measurement system of claim 1, wherein the measurement system comprises at least 4 position quantity sensors.

10. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate, and
    a measurement system according to any of the preceding claims configured to measure a position quantity of one of the support, the substrate table and a projection lens element of the projection system.

11. The measurement system of claim 1, wherein the position quantity calculator comprises a first position dependent measurement system transfer function configured to receive the position quantity measurement signal and to calculate a position of the object from the received position quantity measurement signal and a second position dependent measurement system transfer function configured to receive the estimated torsion from the torsion estimator.

12. The measurement system of claim 11, wherein the first and second position dependent measurement system transfer functions are identical.

13. The measurement system of claim 11, wherein the first and second position measurement system transfer functions are provided in separate parallel paths.

14. A position quantity measurement method to derive a position quantity of an object, the position quantity comprising at least one of position, velocity and acceleration, the measurement method comprising:
    providing by a position quantity sensor a position quantity measurement signal;
    estimating by a torsion estimator a torsion of the object;
    determining by a position quantity calculator a position quantity of the object from the position quantity measurement signal; and correcting the determined position quantity of the object from the estimated torsion.

15. The position quantity measurement method of claim 14, wherein a band filter is applied in a parallel path of the position quantity calculator.

16. The position quantity measurement method of claim 15, wherein the band filter comprises a band stop filter, the method comprising subtracting a torsion corrected position quantity provided by the torsion estimator before the band stop filter and add the torsion corrected position quantity provided by the torsion estimator after the band stop filter.

17. The position quantity measurement method of claim 15, wherein the band filter comprises a band pass filter, the band pass filter and the torsion estimator being provided in a parallel path of the position quantity calculator.

18. The position quantity measurement method of claim 10, wherein a weighting factor matrix is determined from a quotient of a desired mechanics transfer function and a measured mechanics transfer function, a torsion estimator matrix being determined from a mean of a real part of the weighting factor matrix in a frequency band of the torsion.

* * * * *